United States Patent
Tsukamoto

(10) Patent No.: US 7,538,540 B2
(45) Date of Patent: May 26, 2009

(54) BUS BAR CURRENT DETECTING APPARATUS

(75) Inventor: Nobuo Tsukamoto, Kariya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 555 days.

(21) Appl. No.: 11/248,140

(22) Filed: Oct. 13, 2005

(65) Prior Publication Data

US 2006/0082357 A1   Apr. 20, 2006

(30) Foreign Application Priority Data

Oct. 15, 2004   (JP)   ............................. 2004-301964

(51) Int. Cl.
    *G01R 15/20*   (2006.01)
(52) U.S. Cl. .................................. 324/117 R
(58) Field of Classification Search ........................ None
    See application file for complete search history.

(56) References Cited

U.S. PATENT DOCUMENTS

| | | | | |
|---|---|---|---|---|
| 5,243,293 | A * | 9/1993 | Isozaki et al. | 324/522 |
| 6,734,661 | B2 * | 5/2004 | Colby et al. | 324/127 |
| 6,937,003 | B2 * | 8/2005 | Bowman et al. | 324/117 R |
| 7,012,446 | B2 * | 3/2006 | Taguchi et al. | 324/772 |
| 2002/0180417 | A1 * | 12/2002 | Colby et al. | 324/117 R |
| 2004/0251928 | A1 * | 12/2004 | Taguchi et al. | 324/772 |
| 2008/0198548 | A1 * | 8/2008 | Nakamura et al. | 361/689 |

FOREIGN PATENT DOCUMENTS

| | | | |
|---|---|---|---|
| EP | 0 181 759 A2 | | 5/1986 |
| JP | 09304447 A | * | 11/1997 |
| JP | 2002267692 A | * | 9/2002 |
| JP | 2003-004775 | | 1/2003 |
| JP | 2004-061217 | | 2/2004 |
| JP | 2004061217 A | * | 2/2004 |
| JP | 2006112968 A | * | 4/2006 |

OTHER PUBLICATIONS

Kenji Suzuki et al., "The basics of a current sensor and a coreless current sensor", the Dec. 2003 issue of Transistor Technology, CQ Publishing Co., Ltd., pp. 122-137.

* cited by examiner

*Primary Examiner*—Jermele M Hollington
(74) *Attorney, Agent, or Firm*—Kenyon & Kenyon LLP

(57) ABSTRACT

A current detecting portion A includes a magnetic shield attached to a bus bar BU, a magnetic shield attached to a bus bar BV, and a magnetic shield attached to a bus bar BW. On bus bars BV, BU and BW arranged in parallel, current sensors SU, SV and SW are arranged at alternately displaced positions along each bus bar. The magnetic shields are also arranged at alternately displaced positions along each bus bar. The arrangement of the magnetic shield and the current sensors is what is called a staggered arrangement, whereby magnetic interference from an adjacent bus bar to a current sensor can be avoided.

5 Claims, 7 Drawing Sheets

# BUS BAR CURRENT DETECTING APPARATUS

This nonprovisional application is based on Japanese Patent Application No. 2004-301964 filed with the Japan Patent Office on Oct. 15, 2004, the entire contents of which are hereby incorporated by reference.

BACKGROUND OF THE INVENTION

1. Field of the Invention

The present invention relates to a current detecting apparatus, and more specifically, to a current detecting apparatus detecting a current passing through a bus bar.

2. Description of the Background Art

A semiconductor module that controls a-high current to drive a motor is used. For example, as can recently be seen in a hybrid vehicle, an electric vehicle and the like, a semiconductor module employing a power element to drive a motor/generator is used.

A bus bar is provided as a terminal in such a semiconductor module, in order to control the output of a high current. By accurately measuring a current passing through the bus bar and using the measurement result, a motor/generator can accurately be controlled.

Japanese Patent Laying-Open No. 2004-061217 discloses use of what is called a coreless current sensor for measuring a current in a bus bar. The coreless current sensor is a sensor of high accuracy and sensitivity that directly detects a magnetic flux without using a core. As a core is not used, reduction in size and the number of components of the device can be achieved.

However, according to the technology disclosed in Japanese Patent Laying-Open No. 2004-061217, an error correction processing is performed in order to reduce the effect on the measurement result by a magnetic flux passing through an adjacent bus bar. The error correction processing is performed by an operation of software, which makes control complicated.

SUMMARY OF THE INVENTION

An object of the present invention is to provide a current detecting apparatus that is easily controlled and that is small in size.

Summarizing the present invention, a current detecting apparatus includes: a plurality of bus bars each for passing a current; a current sensor sensing a magnetic field near a first bus bar among the plurality of bus bars for detecting a current passing through the first bus bar; and a magnetic shield provided to a second bus bar among the plurality of bus bars that is arranged at a position where magnetic interference to the current sensor may be caused, for reducing the magnetic interference to the current sensor.

Preferably, the current detecting apparatus further includes: a processing portion receiving an output of the current sensor to sense a value of a current passing through a corresponding bus bar; and a flexible substrate with flexibility provided with an interconnection line electrically connecting the processing portion and the current sensor.

Preferably, the current sensors is a current sensor of a coreless type that performs current sensing without using a magnetic core.

According to another aspect of the present invention, a current detecting apparatus includes: a plurality of bus bars each for passing a current, at least part of the plurality of bus bars being arranged in parallel; and a plurality of current sensors respectively arranged to the plurality of bus bars. The plurality of current sensors are arranged at alternately displaced positions along the part of plurality of bus bars being arranged in parallel.

Preferably, each of the plurality of current sensors senses a magnetic field near a corresponding bus bar in order to detect a current passing through the corresponding bus bar, and the current detecting apparatus further includes a plurality of magnetic shields respectively arranged to the plurality of bus bars each for reducing magnetic interference to a current sensor arranged at an adjacent bus bar.

Further preferably, the plurality of magnetic shields are arranged at alternately displaced positions along the part of plurality of bus bars being arranged in parallel.

Preferably, the current detecting apparatus further includes: a processing portion receiving an output of the current sensor to sense a value of a current passing through a corresponding bus bar; and a flexible substrate with flexibility provided with an interconnection line electrically connecting the processing portion and the current sensor.

Preferably, the current sensors is a current sensor of a coreless type that performs current sensing without using a magnetic core.

According to still another aspect of the present invention, a current detecting apparatus includes: a first bus bar for passing a current; a plurality of current sensors arranged to the first bus bar; and a processing portion receiving outputs of the plurality of current sensors to sense a value of the current passing through the first bus bar.

Preferably, the first bus bar has a plate-like shape. The plurality of current sensors include first and second magnetic field sensors sensing a magnetic field near the first bus bar. The first magnetic field sensor is arranged at a top surface of the first bus bar, and the second magnetic field sensor is arranged at a bottom surface of the first bus bar.

Further preferably, the current detecting apparatus further includes an operating portion receiving outputs of the first and second magnetic field sensors and performing a processing of canceling a noise.

Further preferably, the current detecting apparatus further includes: a second bus bar arranged at a position where magnetic interference to the first and second magnetic field sensors may be caused; and a magnetic shield provided to the second bus bar for reducing the magnetic interference to the first and second magnetic field sensors.

Preferably, the first bus bar has a plate-like shape. The plurality of current sensors include first and second magnetic field sensors sensing a magnetic field near the first bus bar. The first and second magnetic field sensors are arranged at an identical surface of the first bus bar.

Further preferably, the current detecting apparatus further includes: a second bus bar arranged at a position where magnetic interference to said first and second magnetic field sensors may be caused; and a magnetic shield provided to said second bus bar for reducing the magnetic interference to said first and second magnetic field sensors.

Preferably, the current detecting apparatus further includes a flexible substrate with flexibility provided with interconnection lines electrically connecting the processing portion and the plurality of current sensors.

Preferably, each of the plurality of current sensors is a current sensor of a coreless type that performs current sensing without using a magnetic core.

Therefore, a major advantage of the present invention is that magnetic interference can be suppressed by the arrangement of current sensors, and that the mounting space of the current detecting apparatus can be made small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
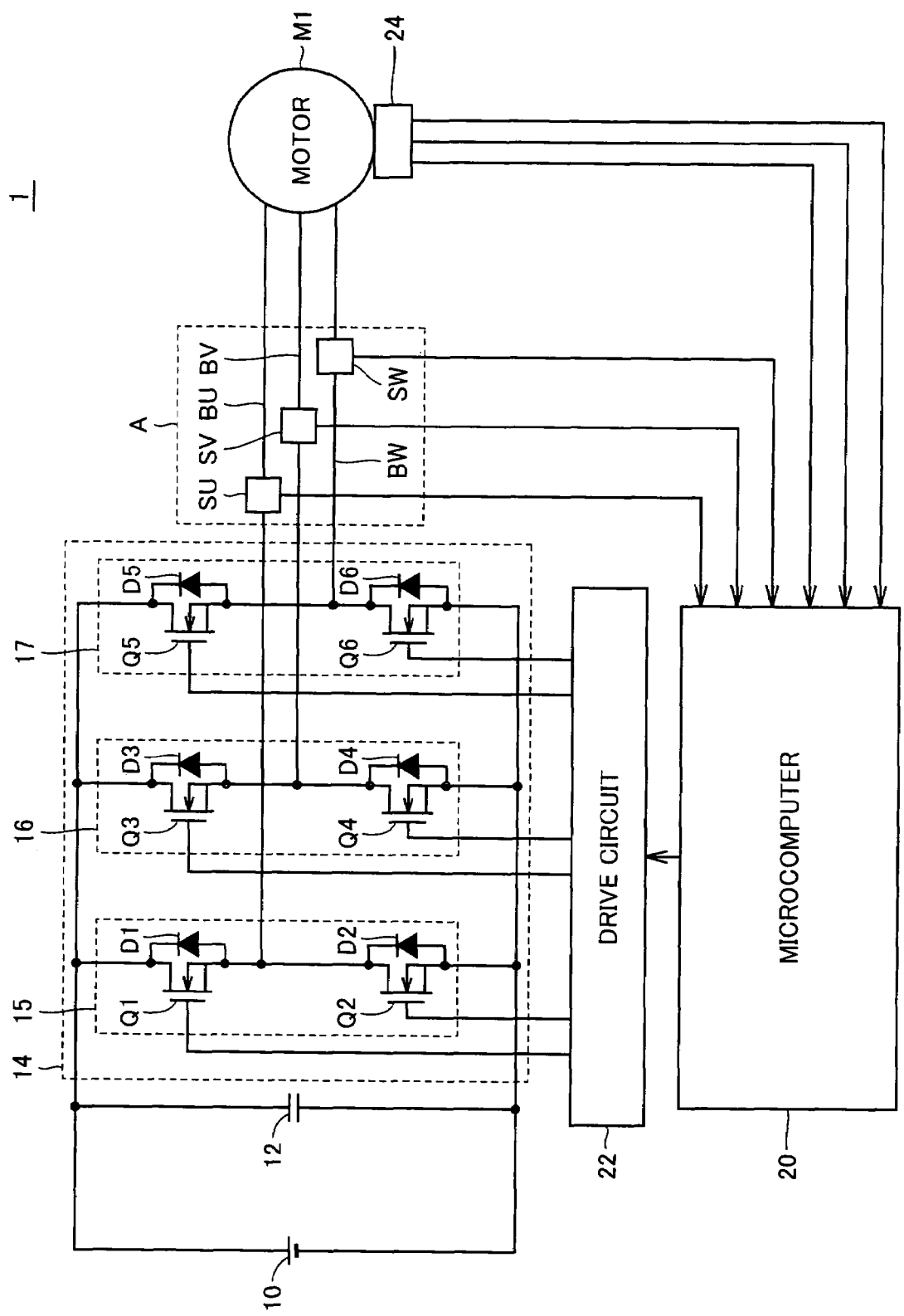
FIG. 1 is a circuit diagram showing a configuration of a motor driving apparatus 1 to which the present invention is applied.

In the following, referring to the drawings, embodiments of the present invention will be described in detail. In the drawings, the same reference character is allotted to the same or the corresponding parts, and description thereof is not repeated.

First Embodiment

FIG. 1 is a circuit diagram showing a configuration of a motor driving apparatus 1 to which the present invention is applied.

Referring to FIG. 1, motor driving apparatus 1 includes a DC (Direct Current) power supply 10, a capacitor 12, an inverter 14, a current detecting portion A, a motor M1, a resolver 24, a microcomputer 20, and a drive circuit 22.

An inverter 14 receives a power supply potential from DC power supply 10 to drive an AC (Alternating Current) motor M1. Preferably, inverter 14 performs regenerative operation in braking of motor M1, to return the electricity generated at AC motor M1 back to DC power supply 10.

Inverter 14 includes a U-phase arm 15, a V-phase arm 16 and a W-phase arm 17. U-phase arm 15, V-phase arm 16 and W-phase arm 17 are connected in parallel in an output line of DC power supply 10. Additionally, capacitor 12 is also connected in the output line of DC power supply 10 in parallel to those components.

U-phase arm 15 includes MOS transistors Q1 and Q2 connected in series, and diodes D1 and D2 respectively connected in parallel to MOS transistors Q1 and Q2.

V-phase arm 16 includes MOS transistors Q3 and Q4 connected in series, and diodes D3 and D4 respectively connected in parallel to MOS transistors Q3 and Q4.

W-phase arm 17 includes MOS transistors Q5 and Q6 connected in series, and diodes D5 and D6 respectively connected in parallel to MOS transistors Q5 and Q6.

A bus bar BU is connected to a connection node of MOS transistors Q1 and Q2. A bus bar BV is connected to a connection node of MOS transistors Q3 and Q4. A bus bar BW is connected to a connection node of MOS transistors Q5 and Q6.

Diodes D1, D3 and D5 are connected in a forward direction that is the direction from the corresponding bus bars toward the positive pole of DC power supply 10. Diodes D2, D4 and D6 are connected in a forward direction that is the direction from the negative pole of DC power supply 10 toward the corresponding bus bars.

Current detecting portion A includes a current sensor SU detecting a current passing through bus bar BU, a current sensor SV detecting a current passing through bus bar BV, and a current sensor SW detecting a current passing through bus bar BW.

Current values detected by current sensors SU, SV and SW are transmitted to microcomputer 20 along with the number of rotation of motor M1 detected by resolver 24. Based on them, microcomputer 20 controls drive circuit 22 to control the number of rotation of motor M1.

Figure 2:
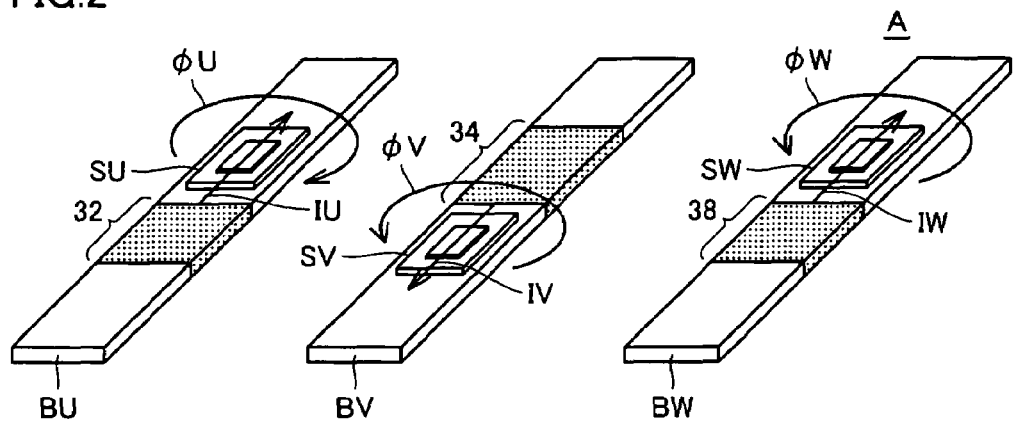
FIG. 2 shows a configuration of a current detecting portion A in FIG. 1.

FIG. 2 shows a configuration of current detecting portion A shown in FIG. 1.

Referring to FIG. 2, current detecting portion A includes bus bars BU, BV and BW each for passing a current, current sensor SU attached to bus bar BU for detecting a current IU passing through bus bar BU, current sensor SV attached to bus bar BV for detecting a current IV passing through bus bar BV, and current sensor SW attached to bus bar BW for detecting a current IW passing through bus bar BW.

Current sensors SU, SV and SW are each for detecting a magnetic field generated when a current passes in the bus bar, to obtain a corresponding current. As such current sensors, a Hall element, an MI (Magnetic Impedance) sensor, an MR (Magneto-Resistive) sensor, an AMR (Anisotropic Magneto-Resistive) sensor and the like can be used.

If the detection accuracy of the sensor itself is high, and if magnetic interference from an adjacent bus bar and the like can be avoided, such sensors can be used as the coreless current sensor. The coreless current sensor is disclosed, for example, in "The basics of a current sensor and a coreless current sensor", the December 2003 issue of Transistor Technology, CQ publishing Co., Ltd., pp. 122-137.

Current detecting portion A further includes a magnetic shield 32 attached to bus bar BU, a magnetic shield 34 attached to bus bar BV, and a magnetic shield 38 attached to bus bar BW, for using the coreless current sensors while avoiding magnetic interference.

The magnetic shields employ the arrangement shown in FIG. 2 so that magnetic interference to the coreless current sensors attached to the adjacent bus bars is reduced. Specifically, on bus bars BU, BV and BW arranged in parallel, current sensors SU, SV and SW are arranged at alternately displaced positions along the bus bars. Similarly, the magnetic shields are arranged at alternately displaced positions along the bus bars. The arrangement of the magnetic shields and the current sensors is what is called a staggered arrangement.

Figure 3:
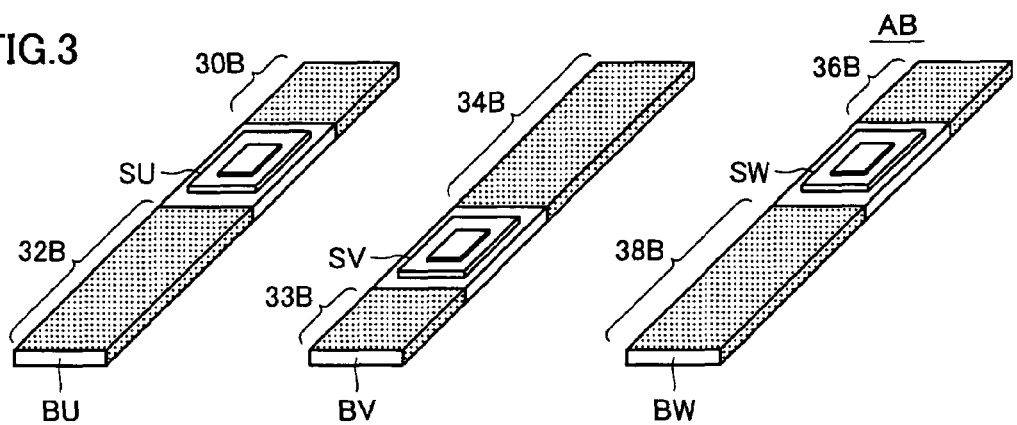
FIG. 3 shows a modification of the current detecting portion shown in FIG. 2.

FIG. 3 is a modification of the current detecting portion shown in FIG. 2.

Referring to FIG. 3, current detecting portion AB includes bus bars BU, BV and BW, and current sensors SU, SV and SW respectively attached to bus bars BU, BV and BW.

Current detecting portion AB further includes magnetic shields 30B and 32B attached to bus bar BU, magnetic shields 33B and 34B attached to bus bar BV, and magnetic shields 36B and 38B attached to bus bar BW, for using the coreless current sensors while avoiding magnetic interference.

The arrangement of FIG. 3 may appear to have unnecessarily broad magnetic shielding range as compared to that of FIG. 2. However, when providing the magnetic shield by coating, the arrangement of FIG. 2 requires masking at two portions for each bus bar, while the arrangement of FIG. 3 advantageously requires masking at only one portion for each bus bar, where a magnetic sensor is attached.

Figure 4:
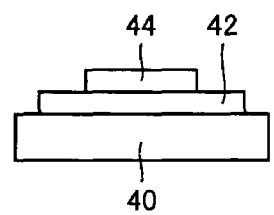
FIG. 4 is a cross-sectional view showing a state where a bus bar is attached to a current sensor.

FIG. 4 is a cross sectional view showing a state where a bus bar is attached to a current sensor.

Referring to FIG. 4, on a top surface of a bus bar 40, a coreless current sensor 44 attached on substrate 42 is arranged. For example, coreless current sensor 44 is an IC and soldered to substrate 42.

Figure 5:
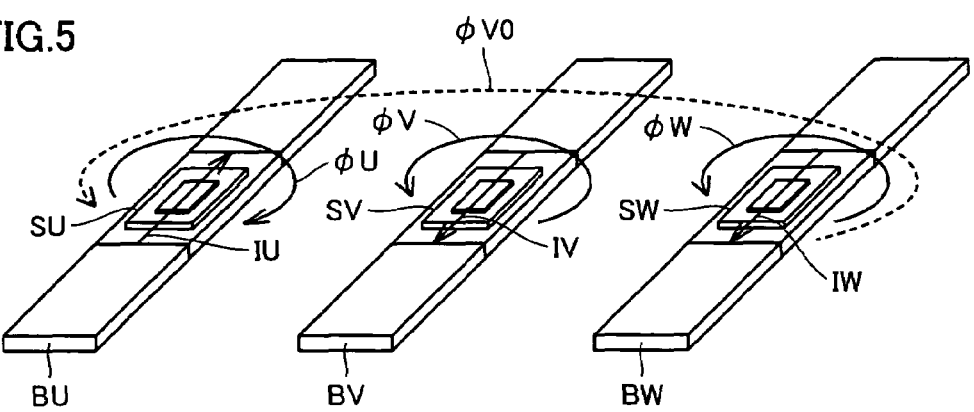
FIG. 5 is an illustration for describing problems that occur when coreless current sensors are simply arranged.

FIG. 5 is an illustration for describing problems that occur when coreless current sensors are simply arranged.

Referring to FIG. 5, for example, assume that current sensors SU, SV and SW are arranged at the same corresponding positions on respective bus bars BU, BV and BW. Current sensor SU is capable of detecting magnetic field $\phi U$ that is generated in accordance with current IU. Current sensor SV is capable of detecting magnetic field $\phi V$ that is generated in accordance with current IV. Current sensor SW is capable of detecting magnetic field $\phi W$ that is generated in accordance with current IW.

However, with such an arrangement, magnetic field $\phi V\mathbf{0}$ generated in accordance with current IV in addition to magnetic field $\phi V$ affects current sensors SU and SW, resulting in errors in the current values being detected.

Accordingly, as shown in FIG. 2, the current sensors are arranged at alternately displaced positions in the direction of bus bars, and a magnetic shield is provided on a bus bar at a region which is adjacent to a region of other bus bar where a current sensor is attached.

As the magnetic shield, for example, an insulating coating may be provided on a metal bus bar, on which a coating that includes nickel, for example, as a pigment may further be provided.

Alternatively, a magnetic shield sheet, which is a thin plate of magnetic material of high permeability that is laminated with a PET film, may be wrapped around a bus bar to be the magnetic shield.

Preferably, the metal portion of the magnetic shield is coupled to a fixed potential such as a ground potential.

Thus, a magnetic sensor of high accuracy is made available without using a core that attracts magnetic flux, whereby magnetic interference is suppressed and the flexibility is improved as the mounting space of the current detection apparatus is reduced.

Second Embodiment

Figure 6:
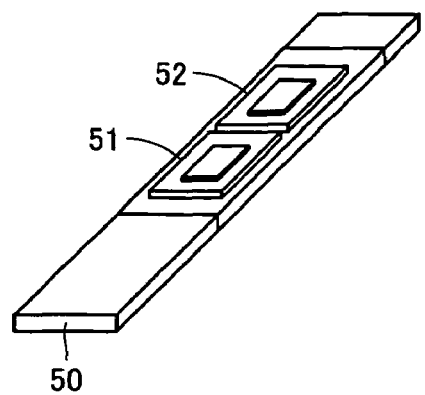
FIG. 6 shows a configuration of a current detecting portion in a second embodiment.

FIG. 6 shows a configuration of a current detecting portion in a second embodiment.

Referring to FIG. 6, two current sensors 51 and 52 are provided on a bus bar 50. Such a double configuration makes it easier to determine normality and abnormality, in case of current sensor failure. For example, such a double configuration may be employed for controlling an on-board motor where high reliability is required.

Figure 7:
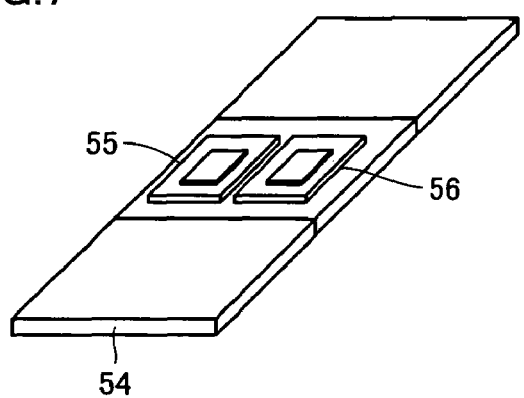
FIG. 7 shows a first modification of a double configuration.

FIG. 7 shows a first modification of a double configuration.

Referring to FIG. 7, on a bus bar 54, current sensors 55 and 56 are arranged next to each other in the width direction of bus bar 54. When a bus bar is wide, the double configuration can be achieved with such an arrangement of the current sensors.

Figure 8:
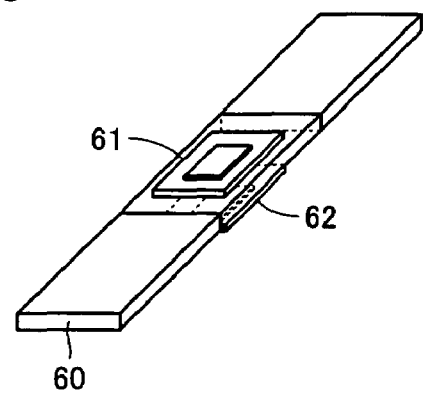
FIG. 8 shows a second modification of the double configuration arrangement.

FIG. 8 shows a second modification of the double configuration arrangement.

Referring to FIG. 8, a current sensor 61 is arranged at a top surface of a bus bar 60, and a current sensor 62 is arranged at a bottom surface of bus bar 60.

Figure 9:
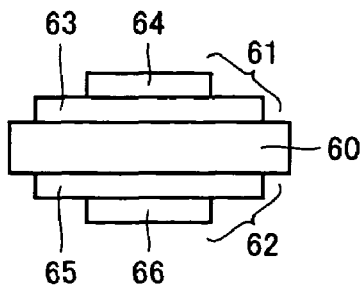
FIG. 9 is a cross-sectional view showing a cross section of the current sensor attached portion shown in FIG. 8.

FIG. 9 is a cross-sectional view showing a cross section of the current sensor attached portion shown in FIG. 8.

Referring to FIG. 9, at the top surface of bus bar 60, current sensor 61 having coreless current sensor 64 mounted on substrate 63 is arranged. At the bottom surface of bus bar 60, current sensor 62 having coreless current sensor 66 mounted on substrate 65 is arranged.

Figure 10:
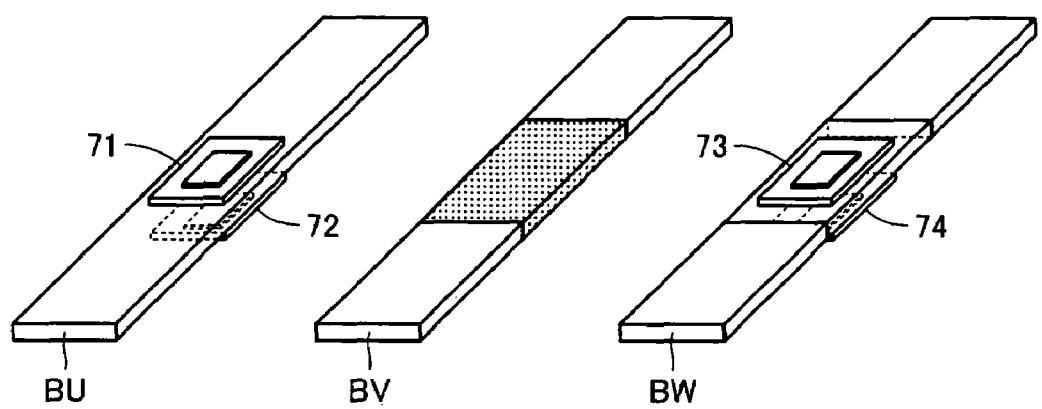
FIG. 10 shows one exemplary current detecting portion employing the configuration shown in FIG. 8.

FIG. 10 shows one exemplary current detecting portion employing the configuration shown in FIG. 8.

Referring to FIG. 10, a current sensor 71 is arranged at a top surface of bus bar BU, while a current sensor 72 is arranged at a bottom surface of bus bar BU. A current sensor 73 is arranged at a top surface of bus bar BW, while a current sensor 74 is arranged at a bottom surface of bus bar BW.

A current sensor may not be provided to bus bar BV in case of an inverter controlling a three-phase AC motor, since the sum of current of U-phase, V-phase and W-phase is 0 and therefore when the current sensors are provided to U-phase and W-phase, the current of V-phase can be obtained through an operation.

At a region of bus bar BV that is adjacent to current sensors, a magnetic shield is provided. While an example where magnetic shield is partially provided to bus bar BV is shown in FIG. 10, the magnetic shield may be provided entirely to bus bar BV.

Providing the shield in such a manner, it is possible to prevent a magnetic field generated by a current passing through bus bar BV from affecting the current sensor attached to adjacent bus bars.

Third Embodiment

Figure 11:
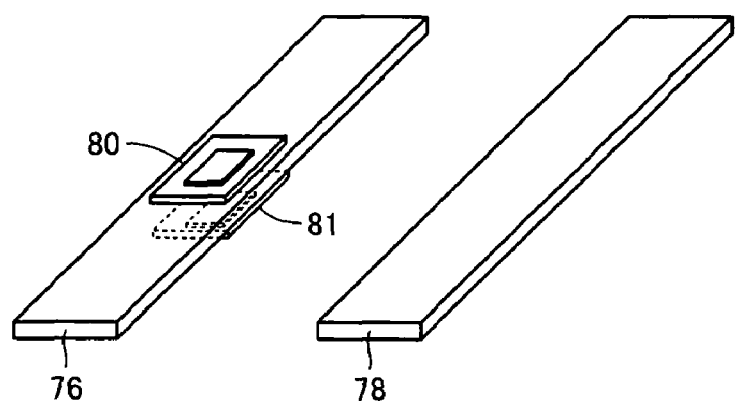
FIG. 11 is an illustration for describing a third embodiment.

FIG. 11 is an illustration for describing a third embodiment.

Referring to FIG. 11, a current detecting portion A2 has a current sensor 80 arranged at a top surface of a bus bar 76 and has a current sensor 81 arranged at a bottom surface of bus bar 76. In contrast to the examples shown in FIGS. 2 and 10 where the magnetic shields are arranged at adjacent bus bars to prevent magnetic interference, it is possible to suppress magnetic interference without providing a magnetic shield to a bus bar 78 adjacent to bus bar 76.

Figure 12:
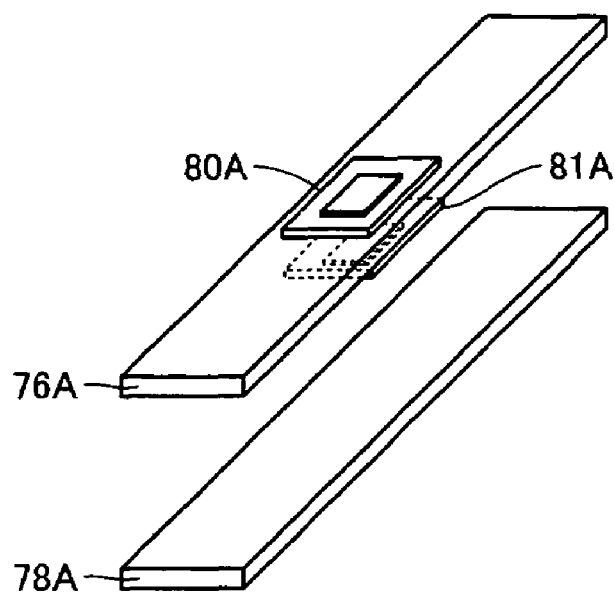
FIG. 12 shows a second arrangement example of the third embodiment.

FIG. 12 shows a second arrangement example of the third embodiment.

Referring to FIG. 12, a current detection portion A3 has a current sensor 80A arranged at a top surface of a bus bar 76A, and has a current sensor 81A arranged at a bottom surface of bus bar 76A.

Figure 13:
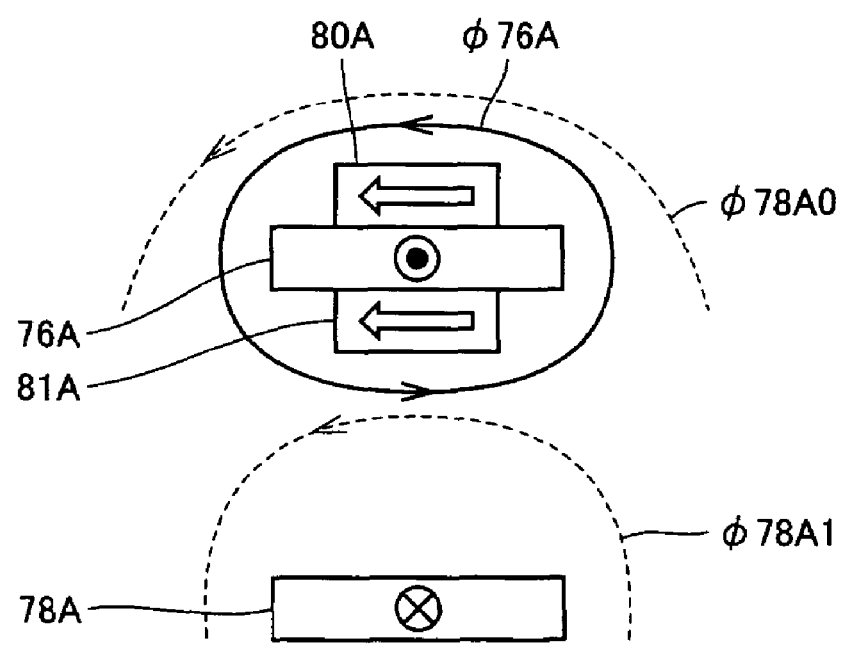
FIG. 13 shows magnetic fields for describing suppression of magnetic interference.

FIG. 13 shows magnetic fields for describing suppression of magnetic interference.

FIG. 13 shows a cross section of the bus bar at the current sensor attached portion. At this moment, in bus bar 76A, a current passes in the front direction. At this moment, in bus bar 78A, a current passes in the depth direction relative to the surface of the figure.

The arrows inside current sensors 80A and 81A indicate forward direction of the sensors in measuring a magnetic field.

At this moment, measured magnetic field φ76A is detected as a positive output at current sensor 80A. Measured magnetic field φ76A is detected as a negative output at current sensor 81A.

On the other hand, magnetic field φ78A0 of noise component attributed to a current passing through bus bar 78A is detected as a positive output at current sensor 80A. Magnetic field φ78A1 of noise component attributed to a current passing through bus bar 78A is detected also as a positive output at current sensor 81A.

Figure 14:
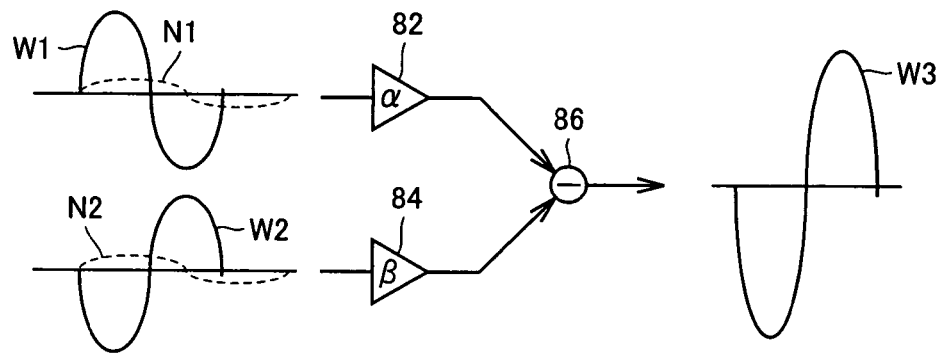
FIG. 14 is a diagram for describing a process for suppressing magnetic interference.

FIG. 14 is a diagram for describing a process for suppressing magnetic interference.

Referring to FIGS. 13 and 14, waveforms W1 and W2 are the magnetic waveforms measured in accordance with a current in bus bar 76A respectively at current sensors 80A and 81A. Waveforms N1 and N2 are the waveforms that are magnetic fields φ78A0 and φ78A1 of noise component detected at current sensors 80A and 81A, respectively. Current sensors 80A and 81A are provided to measure a target magnetic field generated by a current passing through bus bar 76A. On the other hand, current sensors 80A and 81 A are arranged so that they are opposite in the relationship between the forward direction in measuring a magnetic field and the target magnetic field.

Thus, current sensors 80A and 81A detect the target magnetic field in opposite polarity with respect to the effect of adjacent bus bar. Then, by subtracting the difference between an output of current sensor 80A and that of current sensor 81A, the noise is cancelled and only the target magnetic field can be extracted and observed. By using the two sensors, the gain of a signal can also be increased. It is noted that, when the gain of a signal is excessively great, an operation process may be performed by inputting it to microcomputer 20 shown in FIG. 1 and thereafter reducing the magnitude by half.

Actually, the noise components are not the same between two sensors, as the two current sensors are mounted at top and bottom of a bus bar; the distance from an adjacent bus bar may be different; or the bus bar may be covered by a case. Accordingly, it is necessary to pass a current to each phase in a state where sensors are assembled in an actual arrangement, in order to learn the degree of effect of currents passing through the other phase, and to perform weighting α, β individually to outputs from the two assembled current sensors.

Operating portions 82 and 84 performs operations of weighting α, β in accordance with the magnitude of noise to the outputs of sensors. By reading the outputs and subtracting the difference between operating portions 82 and 84 at subtracting portion 86, a waveform W3 can be obtained, from which noise components are just cancelled.

It is noted that the detection direction of current sensor 81A in measuring the magnetic field in FIG. 13 may be reversed. In this case, the same effect can be achieved by replacing subtracting portion 86 with an adding portion.

Other possible noise components that can be cancelled as noise may be geomagnetism and the like.

Fourth Embodiment

Figure 15:
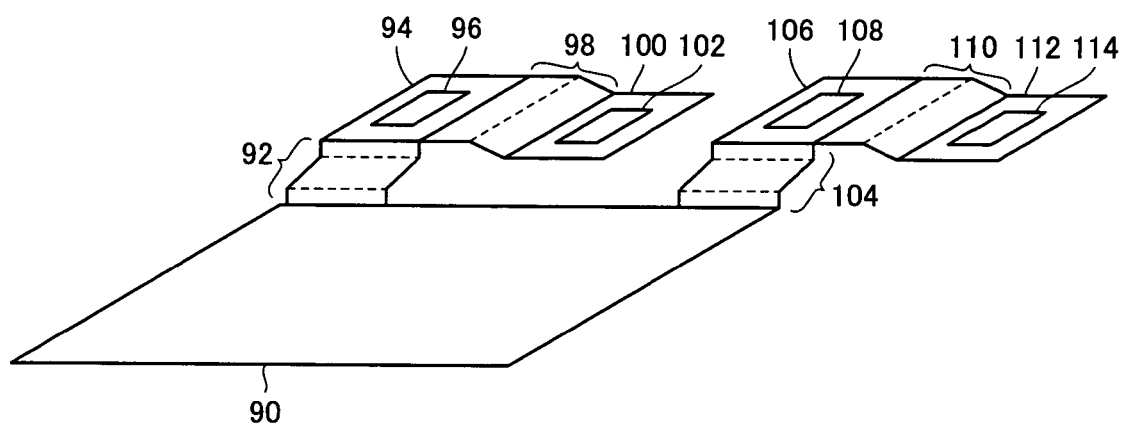
FIG. 15 shows a configuration of a current detecting portion of a fourth embodiment.

FIG. 15 shows a configuration of a current detecting portion of a fourth embodiment.

In FIG. 15, a main board 90, current sensor boards 94, 100, 106, and 112 are rigid substrates. The rigid substrates are connected by flexible substrates 92, 98, 104, and 110. A coreless current sensor 96 is mounted on current sensor board 94, and a coreless current sensor 102 is mounted on current sensor board 100.

A coreless current sensor 108 is mounted on current sensor board 106, and a coreless current sensor 114 is mounted on current sensor board 112.

Thus, the current sensor boards are connected to each other by the flexible substrates in advance, before being attached to the bus bar.

Figure 16:
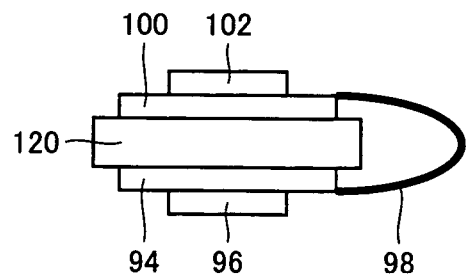
FIG. 16 shows a state where a current detecting portion is attached to a bus bar.

FIG. 16 shows a state where a current detecting portion is attached to a bus bar.

Referring to FIG. 16, current sensor boards 94 and 100 are attached to both sides of bus bar 120, and connected by flexible substrate 98.

Microcomputer 20 shown in FIG. 1 is mounted on main board 90, and a signal from the current sensor to microcomputer 20 is transmitted through an interconnection line formed on the flexible substrate.

Thus, by coupling the flexible boards and the rigid boards and connecting the current sensor boards and the main boards in advance as shown in FIG. 15, the flexible substrate 98 can be bent to facilitate attachment to the bus bar.

Figure 17:
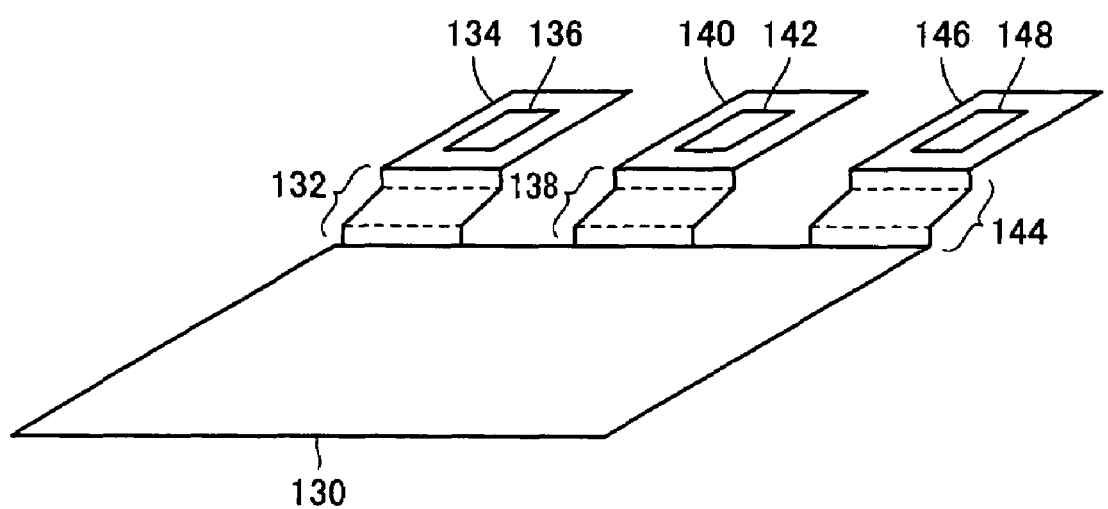
FIG. 17 shows an exemplary case where a current sensor is arranged on one side.

FIG. 17 shows an exemplary case where a current sensor is arranged on one side.

Referring to FIG. 17, coreless current sensors 136, 142 and 148 are respectively mounted on current sensor boards 134, 140 and 146. To main board 130, a current sensing result is transmitted from each of current sensor boards 134, 140 and 146. The current sensor boards and main board 130 are connected by flexible substrate 132, 138, and 144. Flexible substrate includes interconnection lines for transmitting the current sensing result or for supplying power to the sensors.

By connecting the main board and the current sensor boards in advance before mounting on the bus bar, work in assembling the current detecting apparatus to the bus bar can be saved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current detecting apparatus, comprising:
    a plurality of bus bars each for passing a current, at least part of said plurality of bus bars being arranged in parallel; and
    a plurality of current sensors respectively arranged to said plurality of bus bars, wherein
    said plurality of current sensors are arranged at alternately displaced positions along said part of plurality of bus bars being arranged in parallel.

2. The current detecting apparatus according to claim 1, wherein
    each of said plurality of current sensors senses a magnetic field near a corresponding bus bar in order to detect a current passing through the corresponding bus bar, and said current detecting apparatus further comprises a plurality of magnetic shields respectively arranged to said plurality of bus bars each for reducing magnetic interference to a current sensor arranged at an adjacent bus bar.

3. The current detecting apparatus according to claim 2, wherein
said plurality of magnetic shields are arranged at alternately displaced positions along said part of plurality of bus bars being arranged in parallel.

4. The current detecting apparatus according to claim 1, further comprising:

a processing portion receiving an output of said current sensor to sense a value of a current passing through a corresponding bus bar; and
a flexible substrate with flexibility provided with an interconnection line electrically connecting said processing portion and said current sensor.

5. The current detecting apparatus according to claim 1, wherein
said current sensor is a current sensor of a coreless type that performs current sensing without using a magnetic core.

* * * * *